(12) United States Patent
Pan

(10) Patent No.: US 9,035,693 B2
(45) Date of Patent: May 19, 2015

(54) TEMPERATURE DETECTING APPARATUS, SWITCH CAPACITOR APPARATUS AND VOLTAGE INTEGRATING CIRCUIT THEREOF

(71) Applicant: Dong Pan, Boise, ID (US)

(72) Inventor: Dong Pan, Boise, ID (US)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 13/966,300

(22) Filed: Aug. 14, 2013

(65) Prior Publication Data

US 2015/0048886 A1 Feb. 19, 2015

(51) Int. Cl.
| | | |
|---|---|---|
| *G05F 1/10* | (2006.01) | |
| *H03K 17/14* | (2006.01) | |
| *H03F 1/34* | (2006.01) | |
| *H03F 3/45* | (2006.01) | |
| *G01K 7/00* | (2006.01) | |

(52) U.S. Cl.
CPC .............. *H03F 1/34* (2013.01); *H03F 3/45071* (2013.01); *G01K 7/00* (2013.01)

(58) Field of Classification Search
USPC ......... 327/538, 378, 307, 310, 317, 318, 321, 327/558, 157, 336, 341, 345, 540, 541, 83, 327/512, 513; 330/9, 207, 251
See application file for complete search history.

(56) References Cited

U.S. PATENT DOCUMENTS

| | | | | |
|---|---|---|---|---|
| 5,578,949 | A * | 11/1996 | McMorrow, Jr. | 327/103 |
| 6,448,851 | B1 * | 9/2002 | McIntosh et al. | 330/207 A |
| 7,030,688 | B2 * | 4/2006 | Dosho et al. | 327/558 |
| 7,331,708 | B2 * | 2/2008 | Blom et al. | 374/171 |
| 7,710,190 | B2 * | 5/2010 | Oberhuber | 327/512 |
| 7,880,528 | B2 * | 2/2011 | Igarashi | 327/512 |
| 8,536,923 | B2 * | 9/2013 | Gerstenhaber et al. | 327/307 |

* cited by examiner

*Primary Examiner* — Lincoln Donovan
*Assistant Examiner* — Thomas Skibinski
(74) *Attorney, Agent, or Firm* — Jianq Chyun IP Office

(57) ABSTRACT

The invention provides a temperature detecting apparatus, a switch capacitor apparatus and a voltage integrating circuit. The voltage integrating circuit includes an operating amplifier, a capacitor and a current source. The operating amplifier has a positive input end, a negative input end and an output end. The output end of the operating amplifier generates an output voltage, and the positive input end receives a reference voltage. The capacitor is coupled between the output end and the negative input end of the operating amplifier. The current source is coupled to the output end of the operating amplifier. The current source draws a replica current from the capacitor, and a current level of the replica current is determined according to a current level of a current flowing to the negative input end of the operating amplifier.

11 Claims, 4 Drawing Sheets

TEMPERATURE DETECTING APPARATUS, SWITCH CAPACITOR APPARATUS AND VOLTAGE INTEGRATING CIRCUIT THEREOF

BACKGROUND OF THE INVENTION

1. Field of Invention

The present invention generally relates to a voltage integrating circuit, and more particularly to the voltage integrating circuit with a low gain and/or low speed operation amplifier.

2. Description of Prior Art

Referring to FIG. 1, FIG. 1 is a circuit diagram of a conventional voltage integrator 100. The voltage integrator 100 includes a capacitor C1 and an operation amplifier OP1. The operation amplifier OP1 has a positive input end, a negative input end and an output end. The positive input end of the operation amplifier OP1 receives a reference voltage Vref. The capacitor C1 is coupled between the negative input end and the output end of the operation amplifier OP1. The negative input end of the operation amplifier OP1 receives a current $I_{IN}$, and the output end of the operation amplifier OP1 generates an output delta Vout.

In the operation of the voltage integrator 100, the current $I_{IN}$ flows into the negative input end of the operation amplifier OP1, and the output voltage Vout on the output end of the operation amplifier OP1 may be presented as formula (1):

$$\text{Output delta } Vout = I_{IN} \times C1 \times t + Vneg \quad (1),$$

wherein, t is time.

If a gain of the operation amplifier OP1 is high enough (i.e. <60 db), the voltage Vneg on the negative input end of the operation amplifier OP1 is almost equal to the reference voltage Vref, so the output delta $Vout = I_{IN} \times C1 \times t + Vref$. However, if the gain of the operation amplifier OP1 is not high enough, the output delta $Vout = I_{IN} \times C1 \times t + Vref + Voffset$, wherein the voltage Voffset is an offset voltage of the operation amplifier OP1.

When the current $I_{IN}$ flows into the operation amplifier OP1, the output voltage Vout may be pulled down (or up) by the output stage of the operation amplifier OP1. If the operation amplifier OP1 does not have high gain or a response time of the operation amplifier OP1 is slow, the operation amplifier OP1 will has a variable voltage Voffset, and the performance of the voltage integrator is reduced correspondingly.

SUMMARY OF THE INVENTION

The present invention provides a voltage integrating circuit for providing an output voltage with high accuracy.

The present invention provides a temperature detecting apparatus with the voltage integrating circuit mentioned above.

The present invention further provides a switch capacitor apparatus with the voltage integrating circuit mentioned above.

The voltage integrating circuit includes an operating amplifier, a capacitor and a current source. The operating amplifier has a positive input end, a negative input end and an output end. The output end of the operating amplifier generates an output voltage, and the positive input end receives a reference voltage. The capacitor is coupled between the output end and the negative input end of the operating amplifier. The current source is coupled to the output end of the operating amplifier. The current source draws a replica current from the capacitor, and a current level of the replica current is determined according to a current level of a current flowing to the negative input end of the operating amplifier.

The temperature detecting apparatus includes a current generator and a voltage integrating circuit. The current generator generates a temperature sensing current according to an environment temperature. The voltage integrating circuit includes an operating amplifier, a capacitor and a current source. The operating amplifier has a positive input end, a negative input end and an output end. The output end of the operating amplifier generates an output voltage, and the positive input end receives a reference voltage, and the negative input end of the operation amplifier receives the temperature sensing current. The capacitor is coupled between the output end and the negative input end of the operating amplifier. The current source is coupled to the output end of the operating amplifier. The current source draws a replica current from the capacitor, and a current level of the replica current is determined according to a current level of the temperature sensing current.

The switch capacitor apparatus includes a switch capacitor circuit and a voltage integrating circuit. The switch capacitor circuit has a first capacitor, and the switch capacitor circuit switches the first capacitor to receive an input voltage or a reference voltage to generate an output current. The voltage integrating circuit is coupled to the switch capacitor circuit to receive the output current. The voltage integrating circuit includes a first operating amplifier, a second capacitor, and a current source. The first operating amplifier has a positive input end, a negative input end and an output end. The output end of the first operating amplifier generates an output voltage. The positive input end receives a reference voltage, and the negative input end of the first operation amplifier receives the output current. The second capacitor is coupled between the output end and the negative input end of the first operating amplifier. The current source is coupled to the output end of the first operating amplifier. The current source draws a replica current from the second capacitor, and a current level of the replica current is determined according to a current level of the output current.

Accordingly, the presented disclosure provides a voltage integrating circuit, and a current source is used to draw a replica current from the capacitor of the operation amplifier in the voltage integrating circuit. Accordingly, a voltage on the negative input end of the operation amplifier is constant regardless the variation of the current flowing into the negative input end of the operating amplifier. That is, an offset voltage of the operating amplifier is not changed during the voltage integrating circuit is operating. The output voltage with high accuracy generated by the voltage integrating circuit can be achieved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
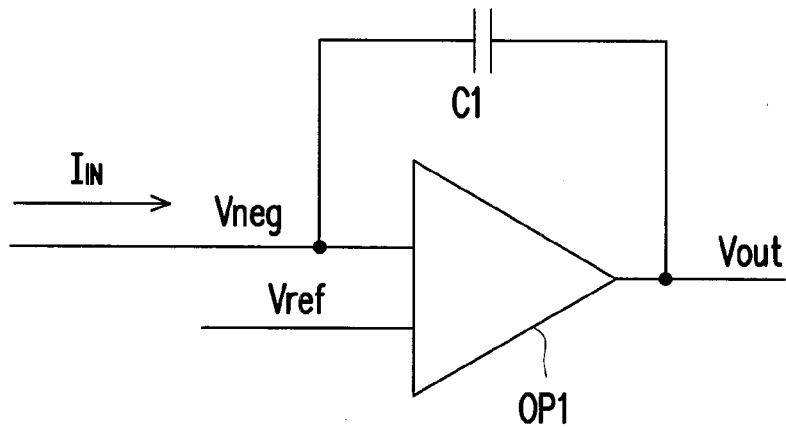
FIG. 1 is a circuit diagram of a conventional voltage integrator 100.

Reference will now be made in detail to the present preferred embodiment of the invention, examples of which are illustrated in the accompanying drawings. Wherever possible, the same reference numbers are used in the drawings and the description to refer to the same or like parts.

Figure 2:
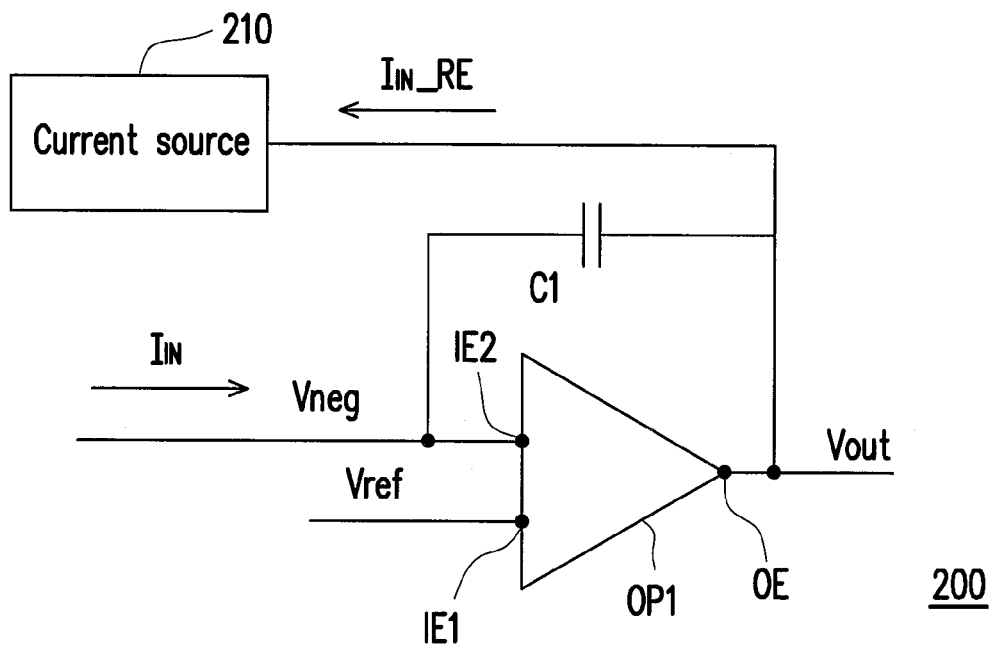
FIG. 2 is a circuit diagram of a voltage integrating circuit 200 according to an embodiment of the present invention.

Please Referring to FIG. 2, FIG. 2 is a circuit diagram of a voltage integrating circuit 200 according to an embodiment of the present invention. The voltage integrating circuit 200 includes an operating amplifier OP1, a capacitor C1, and a current source 210. The operating amplifier OP1 having a positive input end IE1, a negative input end IE2 and an output end OE. The output end OE of the operating amplifier OP1 generates an output voltage Vout, the operating amplifier OP1 receives a reference voltage Vref through the positive input end IE1. A current $I_{IN}$ is fed to the negative input end IE2 of the operation amplifier OP1, and a voltage Vneg is generated on the negative input end IE2 of the operation amplifier OP1 accordingly. The operating amplifier OP1 generates an output voltage Vout on the output end OE of the operation amplifier OP1. The current source 210 is coupled to the output end OE1 of the operation amplifier OP1 and the capacitor C1, and the current source 210 is used to draw a replica current $I_{IN\_RE}$ from the capacitor C1. Please notice here, replica current $I_{IN\_RE}$ is varied according to the current $I_{IN}$. In detail, the current level of the replica current $I_{IN\_RE}$ is in positive proportion to the current level of the current RN flowing to the negative input end IE2 of the operating amplifier OP1. Besides, the voltage Vneg may be kept constant when the current $I_{IN}$ is varied caused by the varied replica current $I_{IN\_RE}$, and the negative feedback of the opamp.

Since the voltage Vneg on the negative input end IE2 of the operation amplifier OP1 is constant, the offset voltage of the operation amplifier OP1 is not changed. If the operation amplifier OP1 is a low gain operation amplifier, the output voltage Vout=$I_{IN}$×C1×t+Vref+Voffset (wherein the voltage Voffset is the offset voltage of the operation amplifier OP1). Since the voltage Voffset is constant, it is not necessary to pull up or pull down the output voltage Vout additionally for the operation amplifier OP1.

If the response speed of the operation amplifier OP1 is slow, the operation amplifier OP1 is not actually do much to pull up or pull down the output voltage Vout. Such as that, the operation amplifier OP1 with lower response speed may be used for a relatively high speed circuit.

Figure 3A:
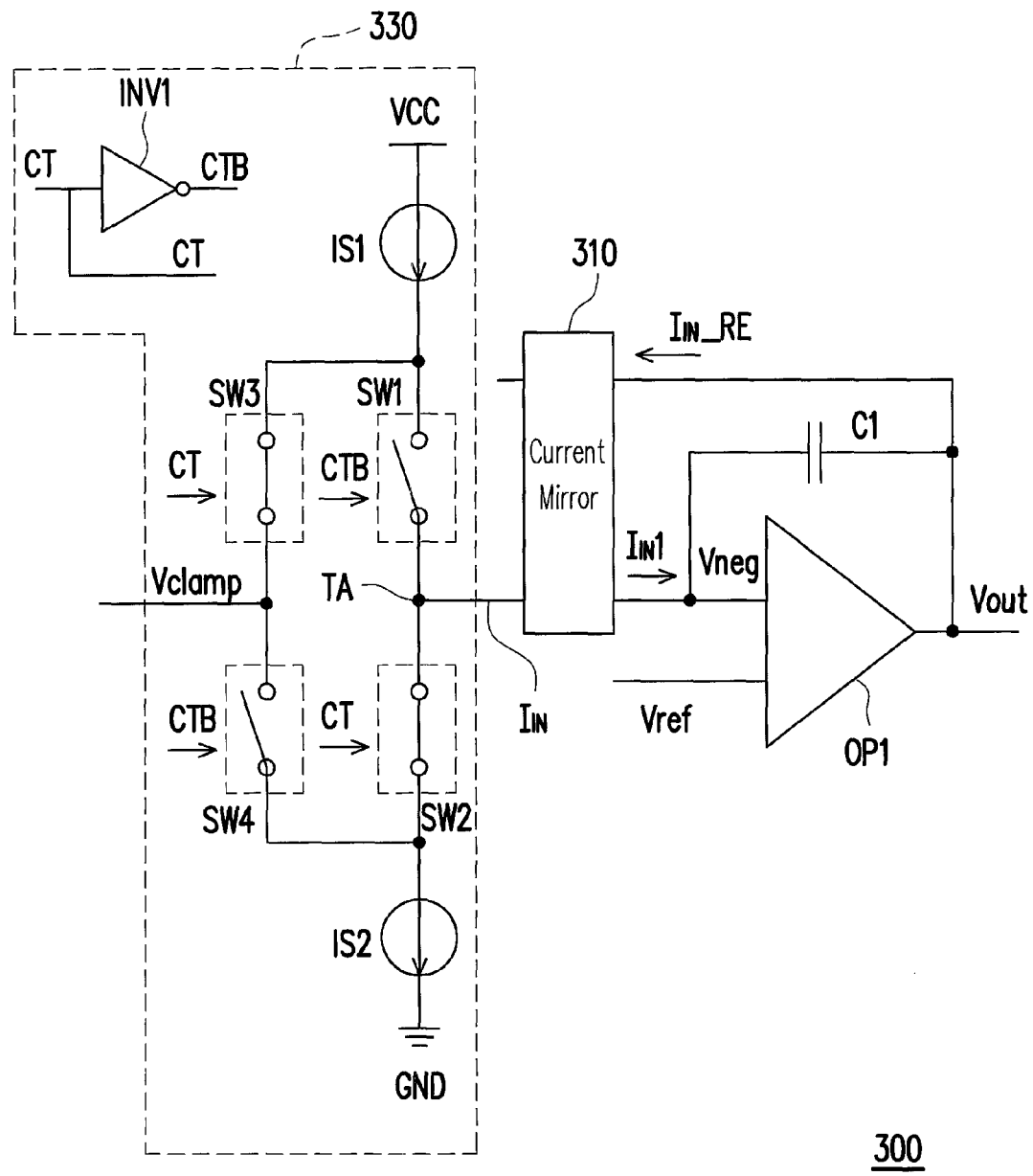
FIG. 3A is a circuit diagram of a temperature detecting apparatus 300 according to an embodiment of the present invention.

Please Referring to FIG. 3A, FIG. 3A is a circuit diagram of a temperature detecting apparatus 300 according to an embodiment of the present invention. The temperature detecting apparatus 300 includes a current generator 330 and a voltage integrating circuit formed by an operation amplifier OP1, a capacitor C1 and a current source 310. The current source 310 is a current mirror. The current generator 330 generates a temperature sensing current $I_{IN}1$ by detecting an environment temperature. In detail, the current generator 330 includes current sources IS1 and IS2 and switches SW1~SW4. The current source IS1 is coupled to a reference voltage VCC, and the current source IS1 provides a first current having a first temperature coefficient. The current source IS2 is coupled to a reference voltage GND, and the current source IS2 provides a second current having a second temperature coefficient. Wherein, the first and second temperature coefficients are complementary. In this embodiment, the first temperature coefficient is positive temperature coefficient, and the second temperature coefficient is negative temperature coefficient.

The switch SW1 is coupled between the current source IS1 and an end TA, and the switch SW1 is controlled by a control signal CTB for connecting or disconnecting the connecting path between the current source IS1 and an end TA. When the switch SW1 is closed, the current source IS1 provides the first current to the end TA, and when the switch SW1 is cut off, the current source IS1 stops to provide the first current to the end TA. The switch SW2 is coupled between the end TA and the current source IS2. The switch SW2 is controlled by an inverted control signal CT. When the switch SW2 is closed, the current source IS2 provides the second current to the end TA, and when the switch SW2 is cut off, the current source IS2 stops to provide the second current to the end TA.

The switch SW3 is coupled between the current source IS1 and a clamping voltage Vclamp. The switch SW3 is controlled by the inverted control signal CT to turn on (close) or turn off (cut off). The switch SW4 is coupled between the current source IS2 and the clamping voltage Vclamp. The switch SW4 is controlled by the control signal CTB to turn on (close) or turn off (cut off).

In the operation of the temperature detecting apparatus 300, the current sources IS1 and IS2 are used to sense the environment temperature. When the environment temperature is increased, the first current generated by the current sources IS1 is increased, and the second current generated by the current sources IS2 is decreased accordingly. By the switching actions of switches SW1-SW4, the current $I_{IN}1$ is increased according to the increasing environment temperature, and the operation amplifier OP1 generates the output voltage Vout correspondingly. On the contrast, when the environment temperature is decreased, the first current generated by the current sources IS1 is decreased, and the second current generated by the current sources IS2 is increased accordingly. By the switching actions of switches SW1-SW4, the current $I_{IN}1$ is decreased according to the decreasing environment temperature, and the operation amplifier OP1 generates the output voltage Vout correspondingly, too.

On the other hand, the control signal CTB may be generated by the inverter INV1 by feeding the inverted control signal CT to the inverter INV1. Besides, in this embodiment, the reference voltage Vref and the clamping voltage Vclamp may be the same.

Please notice here, by keeping the voltage Vneg to be constant, the offset voltage of the operation amplifier OP1 is not varied when the environment temperature is varied. That is, an accuracy output voltage Vout is generated by the operation amplifier OP1.

Figure 3B:
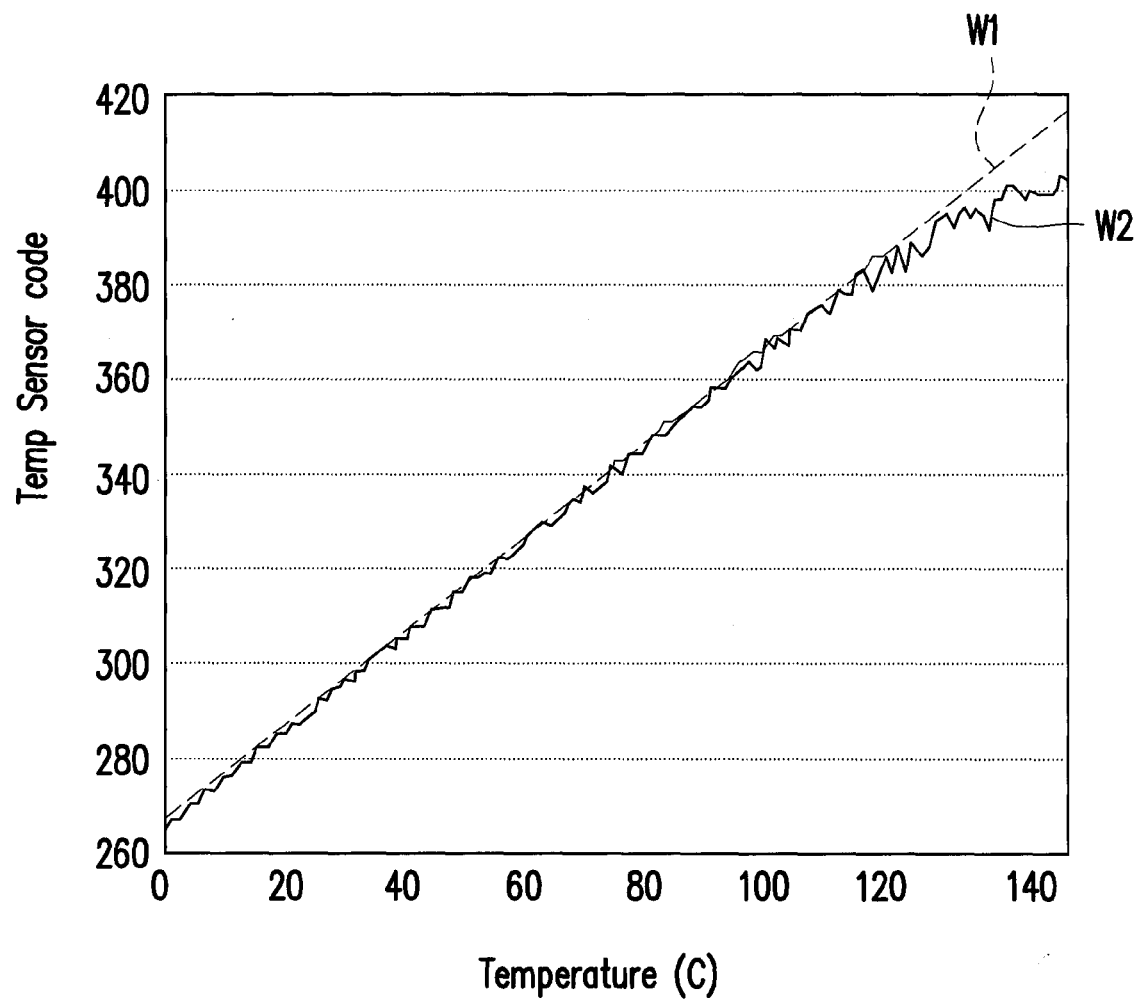
FIG. 3B illustrates a relationship of a temperature sensor code via the environment temperature.

Please referring to FIG. 3B, FIG. 3B illustrates a relationship of a temperature sensor code via the environment temperature, wherein the temperature sensor code is generated according to the output voltage Vout from the operation amplifier OP1. The curve W1 is a relation curve for the embodiment of FIG. 3A, and the curve W2 is a relation curve by using the voltage integrating circuit 100 of FIG. 1. It can be easily seen, there is a large variation on the curve W2.

Figure 4:
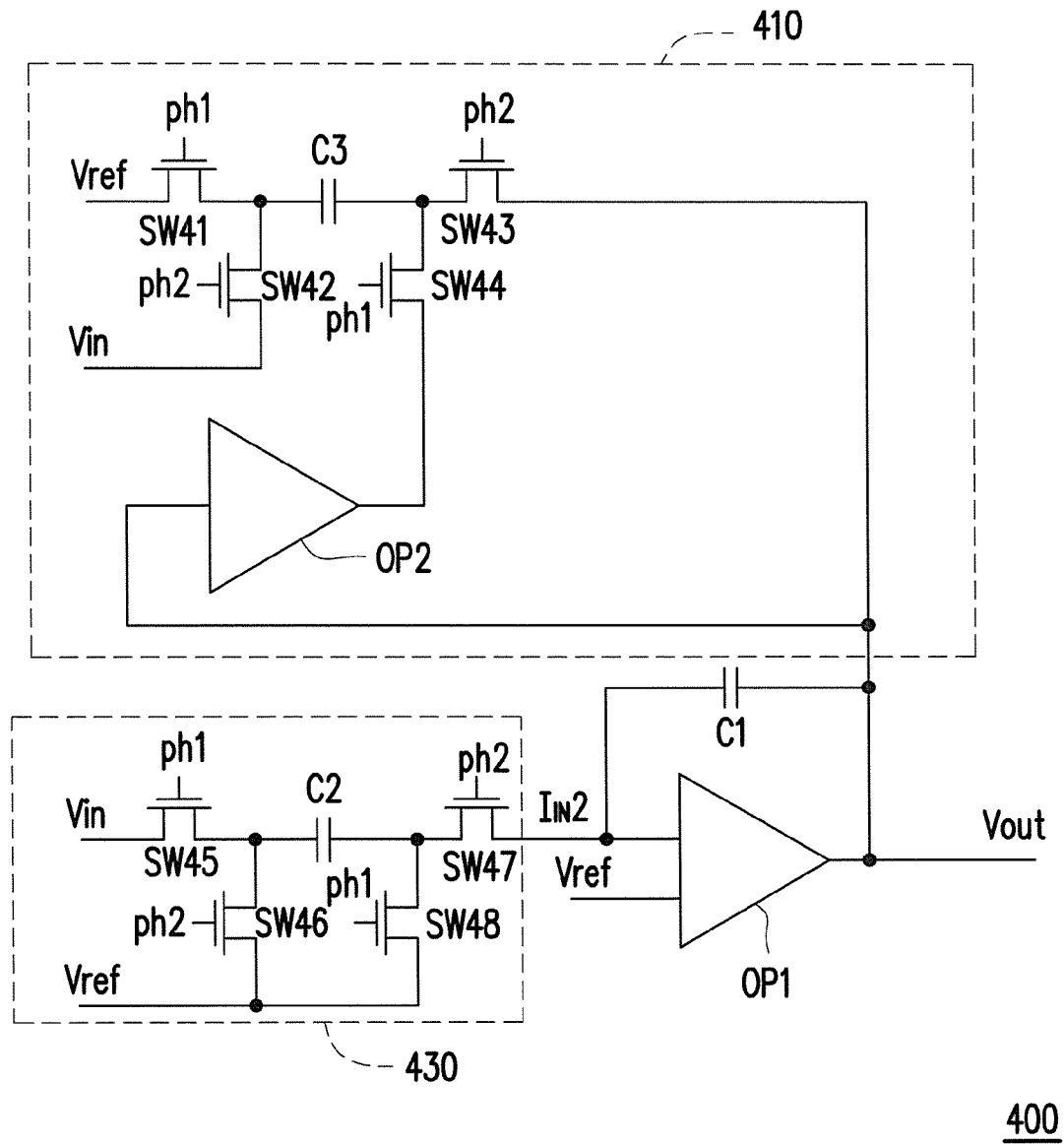
FIG. 4 is a circuit diagram of a switch capacitor apparatus 400.

Please referring to FIG. 4, FIG. 4 is a circuit diagram of a switch capacitor apparatus 400. The switch capacitor apparatus 400 includes a switch capacitor circuit 430 and a voltage integrating circuit formed by a current source 410, an operation amplifier OP1 and a capacitor C1. The switch capacitor circuit 430 has a capacitor C3, and the switch capacitor circuit 430 switches the capacitor C2 to receive an input voltage Vin or a reference voltage Vref to generate an output current I$_{IN}$2. The switch capacitor circuit 430 further includes switches SW45-SW48. The switch SW45 is coupled between the input voltage Vin and the capacitor C2, and the switch SW45 decides to transport the input voltage Vin to a first end of the capacitor C2 or not according to a control signal ph1. The switch SW46 is coupled between the reference voltage Vref and the capacitor C2, and the switch SW46 decides to transport the reference voltage Vref to the first end of the capacitor C2 or not according to a control signal ph2. The switch SW47 is coupled between the capacitor C2 and the operation amplifier OP1, and the switch SW47 is used to couple a second end of the capacitor C2 to the negative input end of the operation amplifier OP1 or not according to the control signal ph2. The switch 48 is coupled between the capacitor C2 and the reference voltage Vref, and the switch 48 is used to couple the second end of the capacitor C2 to the reference voltage Vref or not according to the control signal ph1.

In this embodiment, the switches SW45 and SW46 are not turned on at the same time, and the switches SW47 and SW48 are not turned on at the same time.

The current source 410 includes an operation amplifier OP2, capacitor C3 and switches SW41-SW44. An input end of the operation amplifier OP2 is coupled to the output end of the operation amplifier OP1. The switch SW41 is coupled between the reference voltage Vref and the capacitor C3, and the switch SW41 decides to transport the reference voltage Vref to a first end of the capacitor C3 or not according to the control signal ph1. The switch SW42 is coupled between the input voltage Vin and the capacitor C3, and the switch SW42 decides to transport the input voltage Vin to the first end of the capacitor C3 or not according to the control signal ph2. The switch SW43 is coupled between the capacitor C3 and the output end of the operation amplifier OP1, and the switch SW43 is used to couple the output end of the operation amplifier OP1 to a second end of the capacitor C3 or not according to the control signal ph1. The switch SW44 is coupled between the capacitor C3 and the output end of the operation amplifier OP2, and the switch SW44 is used to couple the output end of the operation amplifier OP1 to the second end of the capacitor C3 or not according to the control signal ph2.

In this embodiment, the switches SW41 and SW42 are not turned on at the same time, and the switches SW43 and SW44 are not turned on at the same time.

In summary, the presented disclosure provides the current source for drawing the replica current from the capacitor of the voltage integrating circuit. The current level of the replica current is varied according to a current level of the current flowing to the negative input end of the operation amplifier of the voltage integrating circuit. That is, the voltage on the negative input end of the operation amplifier can be kept constant, and the offset voltage of the operation amplifier is not changed. Accordingly, a high accuracy output voltage can be generated by the voltage integrating circuit, regardless the operation amplifier is a low gain and/or the response speed of operation amplifier is slow.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A voltage integrating circuit, comprising:
    an operating amplifier, having a positive input end, a negative input end and an output end, the output end of the operating amplifier generating an output voltage, the positive input end receiving a reference voltage;
    a capacitor, having a first end connected to the output end and a second end connected to the negative input end of the operating amplifier; and
    a current source, directly connected to the output end of the operating amplifier, the current source drawing a replica current from the first end of the capacitor, and a current level of the replica current is determined according to a current level of a current flowing to the negative input end of the operating amplifier.

2. The voltage integrating circuit according to claim 1, wherein a voltage level of the voltage on the negative input end of the operating amplifier is constant.

3. The voltage integrating circuit according to claim 1, wherein the current level of the replica current is in positive proportion to the current level of the current flowing to the negative input end of the operating amplifier.

4. The voltage integrating circuit according to claim 1, wherein the replica current is generated by mirroring the current flowing to the negative input end of the operating amplifier.

5. The voltage integrating circuit according to claim 4, wherein the current source comprises:
    a current mirror, coupled to the output end of the operation amplifier, the current mirror generates the replica current is generated by mirroring the current flowing to the negative input end of the operating amplifier.

6. A temperature detecting apparatus, comprising:
    a current generator, generating a temperature sensing current according to an environment temperature; and
    a voltage integrating circuit, coupled to the current generator, comprising:
        an operating amplifier, having a positive input end, a negative input end and an output end, the output end of the operating amplifier generating an output voltage;
    the positive input end receiving a reference voltage, and the negative input end of the operating amplifier receiving the temperature sensing current;
    a capacitor, coupled between the output end and the negative input end of the operating amplifier; and
    a first current source, directly connected to the output end of the operating amplifier, the first current source drawing a replica current from the capacitor, and a current level of the replica current is determined according to a current level of the temperature sensing current.

7. The temperature detecting apparatus according to claim 6, wherein a voltage level of the voltage on the negative input end of the operating amplifier is constant.

8. The temperature detecting apparatus according to claim 6, wherein the current level of the replica current is in positive proportion to the current level of the temperature sensing current.

9. The temperature detecting apparatus according to claim 6, wherein the replica current is generated by mirroring the temperature sensing current.

10. The temperature detecting apparatus according to claim 9, wherein the first current source comprises:
    a current mirror, coupled to the output end of the operation amplifier, the current mirror generates the replica current is generated by mirroring the temperature sensing current.

11. The temperature detecting apparatus according to claim 6, wherein the current generator comprises:
    a second current source, provides a first current having a first temperature coefficient;
    a third current source, provides a second current having a second temperature coefficient, the first temperature coefficient and the second temperature coefficient are complementary;
    a first switch, coupled between the second current source and the second end of the operation amplifier, the first switch is controlled by a control signal to turn on or turn off;
    a second switch, coupled between the third current source and the second end of the operation amplifier, the second switch is controlled by an inverted control signal to turn on or turn off, wherein status of the first switch and the second switch are complementary;
    a third switch, coupled between the second current source and a clamping voltage, the third switch is controlled by the inverted control signal to turn on or turn off; and
    a fourth switch, coupled between the third current source and the clamping voltage, the third switch is controlled by the control signal to turn on or turn off, wherein status of the third switch and the fourth switch are complementary, status of the third switch and the first switch are complementary.

\* \* \* \* \*